United States Patent
Li et al.

(10) Patent No.: US 9,299,304 B2
(45) Date of Patent: Mar. 29, 2016

(54) GATE DRIVING CIRCUIT

(71) Applicant: CHUNGHWA PICTURE TUBES, LTD., Taoyuan (TW)

(72) Inventors: Wei-Lung Li, Taoyuan County (TW); Chih-Wen Lai, Nantou County (TW)

(73) Assignee: CHUNGHWA PICTURE TUBES, LTD., Taoyuan (TW)

( * ) Notice: Subject to any disclaimer, the term of this patent is extended or adjusted under 35 U.S.C. 154(b) by 231 days.

(21) Appl. No.: 14/025,845

(22) Filed: Sep. 13, 2013

(65) Prior Publication Data

US 2014/0320175 A1    Oct. 30, 2014

(30) Foreign Application Priority Data

Apr. 26, 2013 (TW) .............................. 102115112 A

(51) Int. Cl.
*G11C 19/00* (2006.01)
*G09G 3/36* (2006.01)
*G11C 19/28* (2006.01)

(52) U.S. Cl.
CPC ...... *G09G 3/3674* (2013.01); *G09G 2310/0283* (2013.01); *G09G 2320/0247* (2013.01); *G09G 2330/021* (2013.01); *G11C 19/28* (2013.01)

(58) Field of Classification Search
None
See application file for complete search history.

(56) References Cited

U.S. PATENT DOCUMENTS

| | | | |
|---|---|---|---|
| 6,970,530 B1 * | 11/2005 | Wang et al. | 377/69 |
| 2006/0269038 A1 * | 11/2006 | Jang et al. | 377/64 |
| 2008/0012818 A1 | 1/2008 | Lee et al. | |
| 2008/0101529 A1 * | 5/2008 | Tobita | 377/64 |
| 2008/0102818 A1 | 5/2008 | McArdle | |
| 2009/0041177 A1 * | 2/2009 | Chien et al. | 377/64 |
| 2011/0122988 A1 * | 5/2011 | Miyayama et al. | 377/64 |
| 2011/0157124 A1 | 6/2011 | Jung et al. | |
| 2012/0087461 A1 * | 4/2012 | Liu et al. | 377/69 |
| 2012/0213323 A1 * | 8/2012 | Tsai | 377/64 |
| 2013/0243150 A1 * | 9/2013 | Jang et al. | 377/64 |
| 2014/0168044 A1 * | 6/2014 | Hu et al. | 345/90 |
| 2014/0168050 A1 * | 6/2014 | Gu et al. | 345/100 |
| 2014/0192039 A1 * | 7/2014 | Wang et al. | 345/213 |
| 2014/0253424 A1 * | 9/2014 | Yu et al. | 345/100 |

FOREIGN PATENT DOCUMENTS

| | | |
|---|---|---|
| CN | 101533623 A | 9/2009 |
| CN | 101710476 A | 5/2010 |
| CN | 102034423 A | 4/2011 |
| CN | 102592559 A | 7/2012 |

(Continued)

*Primary Examiner* — Tuan T Lam

(74) *Attorney, Agent, or Firm* — CKC & Partners Co., Ltd.

(57) ABSTRACT

A gate driving circuit includes a first input terminal, a second input terminal, a third input terminal, an output terminal, a first transistor, a second transistor, a third transistor, and a capacitor. The first terminal of the first transistor is coupled to the first input terminal. The control terminal of the first transistor is coupled to the second input terminal. The first terminal of the second transistor is coupled to the third input terminal. The control terminal of the second transistor is coupled to the second terminal of the first transistor. The second terminal of the second transistor is coupled to the output terminal. The first terminal of the third transistor is coupled to the output terminal. The second terminal of the third transistor is coupled to ground terminal. The capacitor is coupled between the control terminal of the second transistor and the output terminal.

20 Claims, 5 Drawing Sheets

(56) References Cited

FOREIGN PATENT DOCUMENTS

| CN | 102592561 A | 7/2012 |
|---|---|---|
| CN | 103035298 A | 4/2013 |
| JP | 2006023705 A | 1/2006 |
| JP | 2013069400 A | 4/2013 |
| TW | M373545 | 2/2010 |
| TW | 201131244 A | 9/2011 |
| TW | 201227655 A | 7/2012 |

* cited by examiner

GATE DRIVING CIRCUIT

RELATED APPLICATIONS

This application claims priority to Taiwanese Application Serial Number 102115112, filed Apr. 26, 2013, which is herein incorporated by reference.

BACKGROUND

1. Field of Invention

The embodiment of the present invention relates generally to a gate driving circuit and, more particularly, to a gate-in-panel driving circuit.

2. Description of Related Art

With technological progress, consumer's requirement to resolution of liquid crystal displays (LCD) is increased day by day. In order to manufacture LCDs with a high resolution, a gate-in-panel (GIP) circuit has been introduced, and such a circuit is gradually being adopted by industry.

For example, in an eight stage circuit structure with bidirectional scan mode, output signals provided by the eight stage circuit is as shown in FIG. 1. The output signal Gout(n) and the output signal Gout(n+1) overlap each other. Specifically, about three-quarters of the output signal Gout(n) overlap with the output signal Gout(n+1), and this results in pixel flickering and higher circuit power consumption.

There has been much effort in trying to find a solution to the aforementioned problems. Nonetheless, there is still a need to improve the existing apparatuses and techniques in the art.

SUMMARY

One purpose of embodiments of the invention is to provide a gate driving circuit which improves the problem of pixel flickering and higher circuit power consumption resulting from the output signals of gate driving circuit stages overlapping each other.

For achieving the foregoing purpose, one aspect of the present invention is related to a gate driving circuit. The gate driving circuit comprises a first input terminal, a second input terminal, a third input terminal, an output terminal, a first transistor, a second transistor, a third transistor, a voltage regulator circuit, a capacitor, and a pull-down circuit. Furthermore, the first transistor comprises a first terminal, a control terminal, and a second terminal. The second transistor comprises a first terminal, a control terminal, and a second terminal. The third comprises a first terminal, a control terminal, and a second terminal. With respect to the operation, the first input terminal is configured to receive a first scan signal, the second input terminal is configured to receive a first input signal, and the third input terminal is configured to receive a first clock signal. With respect to the structure, the first terminal of the first transistor is electrically coupled to the first input terminal, and the control terminal of the first transistor is electrically coupled to the second input terminal. The first terminal of the second transistor is electrically coupled to the third input terminal, the control terminal of the second transistor is electrically coupled to the second terminal of the first transistor, and the second terminal of the second transistor is electrically coupled to the output terminal. The first terminal of the third transistor is electrically coupled to the output terminal, and the second terminal of the third transistor is electrically coupled to a ground terminal. The voltage regulator circuit is electrically coupled to the control terminal of the second transistor, the control terminal of the third transistor, and the ground terminal. The capacitor is electrically coupled between the control terminal of the second transistor and the output terminal. The pull-down circuit is electrically coupled to the output terminal and the ground terminal.

In one embodiment of the present invention, the gate driving circuit further comprises a fourth input terminal and a fifth input terminal. The fourth input terminal is configured to receive a second clock signal, and the fifth input terminal is configured to receive the first scan signal. In addition, the pull-down circuit comprises a fourth transistor and a fifth transistor. The fourth transistor comprises a first terminal, a control terminal, and a second terminal, and the fifth transistor comprises a first terminal, a control terminal, and a second terminal. With respect to the structure, the first terminal of the fourth transistor is electrically coupled to the output terminal, and the control terminal of the fourth transistor is electrically coupled to the fourth input terminal. The first terminal of the fifth transistor is electrically coupled to the second terminal of the fourth transistor, the control terminal of the fifth transistor is electrically coupled to the fifth input terminal, and the second terminal of the fifth transistor is electrically coupled to the ground terminal.

In another embodiment of the present invention, the gate driving circuit further comprises a fourth input terminal and a fifth input terminal. The fourth input terminal is configured to receive a second clock signal, and the fifth input terminal is configured to receive the first scan signal. In addition, the pull-down circuit comprises a fourth transistor and a fifth transistor. The fourth transistor comprises a first terminal, a control terminal, and a second terminal, and the fifth transistor comprises a first terminal, a control terminal, and a second terminal. With respect to the structure, the first terminal of the fourth transistor is electrically coupled to the output terminal, and the second terminal of the fourth transistor is electrically coupled to the ground terminal. The first terminal of the fifth transistor is electrically coupled to the fourth input terminal, the control terminal of the fifth transistor is electrically coupled to the fifth input terminal, and the second terminal of the fifth transistor is electrically coupled to the control terminal of the fourth transistor.

In yet another embodiment of the present invention, the second dock signal is a quarter of a period behind the first clock signal.

In still another embodiment of the present invention, in a forward scan period, the first scan signal is a logic high level signal.

In yet another embodiment of the present invention, the gate driving circuit further comprises a sixth input terminal, a seventh input terminal, and a sixth transistor. The sixth input terminal is configured to receive a second scan signal. The seventh input terminal is configured to receive a second input signal. The sixth transistor comprises a first terminal, a control terminal, and a second terminal. With respect to the structure, the first terminal of the sixth transistor is electrically coupled to the sixth input terminal, the control terminal of the sixth transistor is electrically coupled to the seventh input terminal, and the second terminal of the sixth transistor is electrically coupled to the control terminal of the second transistor.

In still another embodiment of the present invention, the gate driving circuit further comprises an eighth input terminal and a ninth input terminal. The eighth input terminal is configured to receive a third clock signal, and the ninth input terminal is configured to receive a second scan signal. The pull-down circuit comprises a seventh transistor and an eighth transistor. The seventh transistor comprises a first terminal, a control terminal, and a second terminal, and the eighth transistor comprise a first terminal, a control terminal, and a second terminal. With respect to the structure, the first terminal of the seventh transistor is electrically coupled to the output terminal, and the control terminal of the seventh transistor is electrically coupled to the eighth input terminal. The first terminal of the eighth transistor is electrically coupled to the second terminal of the seventh transistor, the control terminal of the eighth transistor is electrically coupled to the ninth input terminal, and the second terminal of the eighth transistor is electrically coupled to the ground terminal.

In yet another embodiment of the present invention, the gate driving circuit further comprises an eighth input terminal and a ninth input terminal. The eighth input terminal is configured to receive a third clock signal, and the ninth input terminal is configured to receive a second scan signal. The pull-down circuit comprises a seventh transistor and an eighth transistor. The seventh transistor comprises a first terminal, a control terminal, and a second terminal, and the eighth transistor comprises a first terminal, a control terminal, and a second terminal. With respect to the structure, the first terminal of the seventh transistor is electrically coupled to the output terminal, and the second terminal of the seventh transistor is electrically coupled to the ground terminal. The first terminal of the eighth transistor is electrically coupled to the eighth input terminal, the control terminal of the eighth transistor is electrically coupled to the ninth input terminal, and the second terminal of the eighth transistor is electrically coupled to the control terminal of the seventh transistor.

In still another embodiment of the present invention, the third clock signal is a quarter of a period behind the first clock signal.

In yet another embodiment of the present invention, in a backward scan period, the second scan signal is a logic high level signal.

DETAILED DESCRIPTION

Figure 2:
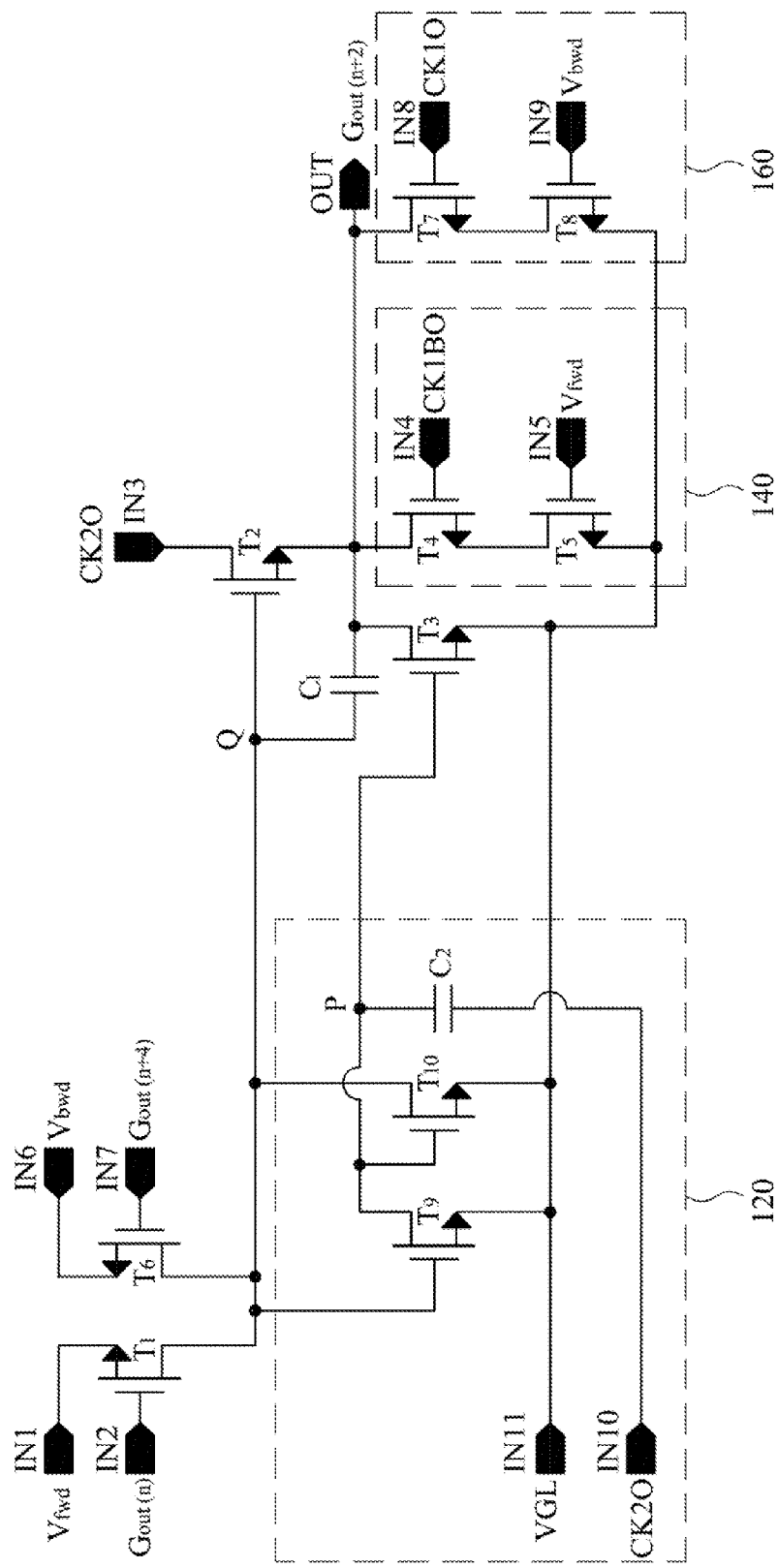
FIG. 2 schematically shows a diagram of a gate driving circuit according to embodiments of the present invention.

FIG. 2 schematically shows a diagram of a gate driving circuit according to embodiments of the present invention.

As shown in FIG. 2, the gate driving circuit of one embodiment of the present invention comprises a first input terminal IN1, a second input terminal IN2, a third input terminal IN3, an output terminal OUT, a first transistor T1, a second transistor T2, a third transistor T3, a voltage regulator circuit 120, a first capacitor C1, and a pull-down circuit 140. Furthermore, each of the first transistor T1, the second transistor T2, and the third transistor T3 respectively comprises a first terminal, a control terminal, and a second terminal.

With respect to operation, the first input terminal IN1 is configured to receive a first scan signal Vfwd, the second input terminal IN2 is configured to receive a first input signal Gout(n), the third input terminal IN3 is configured to receive a first clock signal CK2O, and the output terminal OUT is configured to output an output signal Gout(n+2).

With respect to structure, the first terminal of the first transistor T1 is electrically coupled to the first input terminal IN1, the control terminal of the first transistor T1 is electrically coupled to second input terminal IN2, the first terminal of the second transistor T2 is electrically coupled to the third input terminal IN3, the control terminal of the second transistor T2 is electrically coupled to the second terminal of the first transistor T1, and the second terminal of the second transistor T2 is electrically coupled to the output terminal OUT. The voltage regulator circuit 120 at least comprises an eleventh input terminal IN11. The eleventh input terminal IN11 is configured to receive a ground signal, or alternatively, the voltage regulator circuit 120 may be coupled to a ground terminal through the eleventh input terminal IN11. In addition, the voltage regulator circuit 120 is electrically coupled to the control terminal of the second transistor T2 and the control terminal of the third transistor T3. The first terminal of the third transistor T3 is electrically coupled to the output terminal OUT, and the second terminal of the third transistor T3 is electrically coupled to the ground terminal through the voltage regulator circuit 120. The first capacitor C1 is electrically coupled between the control terminal of the second transistor T2 and the output terminal OUT. The pull-down circuit 140 is electrically coupled to the output terminal OUT, and the pull-down circuit 140 is electrically coupled to the ground terminal through the voltage regulator circuit 120.

When implementing the present invention, the transistor can be a metal-oxide-semiconductor field-effect transistor (MOSFET). The first terminal of the foregoing transistors can selectively be one of the drain and source, and the second terminal of the foregoing transistors can correspondingly be the other of the drain and source. The control terminal of the transistor can be the gate. However, the scope of the present invention is not intended to be limited in this regard, and those skilled in the art can selectively adopt appropriate electronic elements depending on actual requirements.

Figure 3:
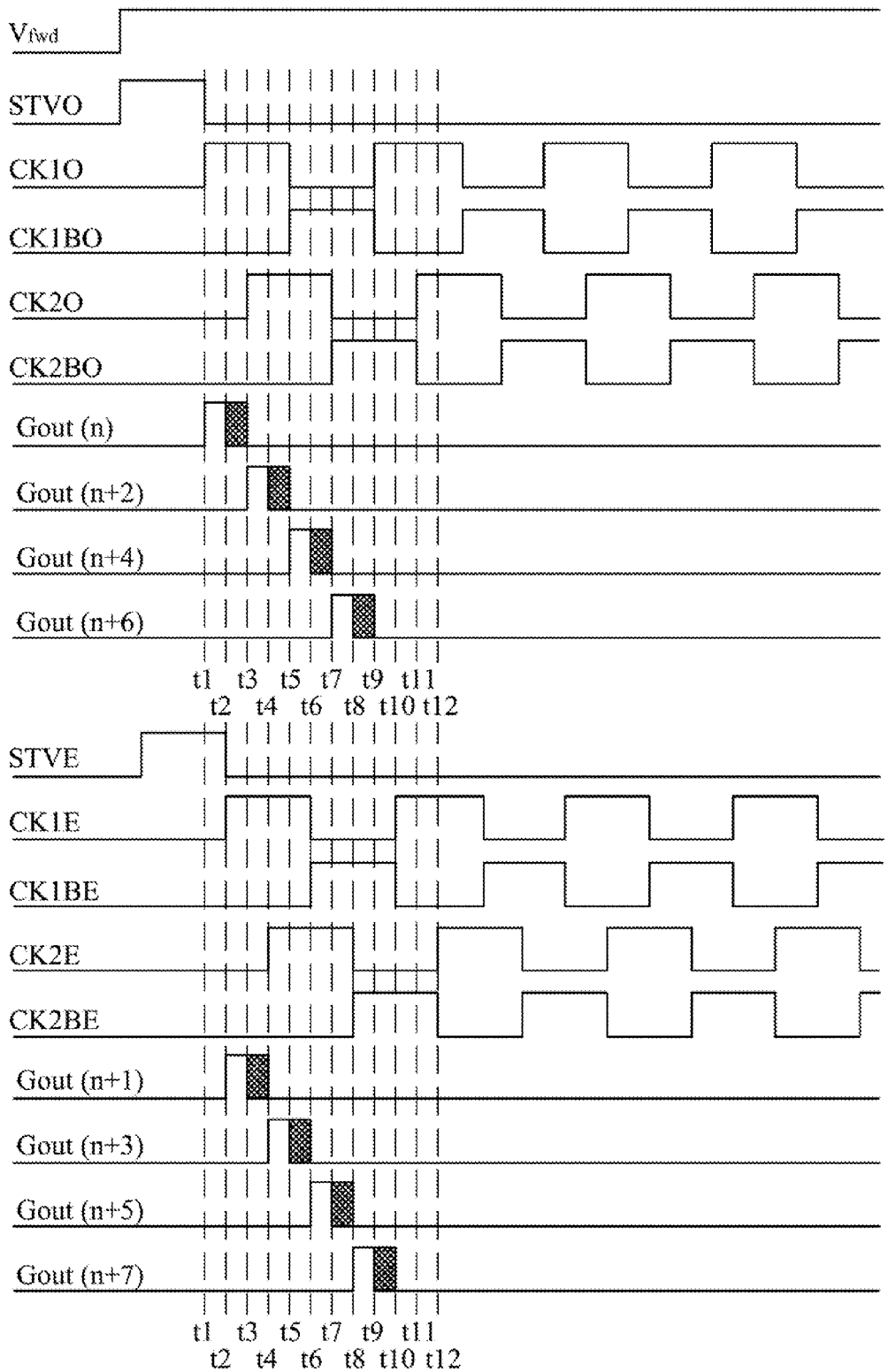
FIG. 3 schematically shows an operation waveform diagram of a gate driving circuit according to embodiments of the present invention.

For easy understanding of the overall operation of the gate driving circuit of the embodiment of the present invention, reference is now made to both FIGS. 2 and 3, in which FIG. 3 schematically shows an operation waveform diagram of a gate driving circuit according to embodiments of the present invention. First, a condition in which the signal is in a forward scanning period is described herein. At this time, the first scan signal Vfwd is a logic high level signal. The n+2 stage circuit of the gate driving circuit of the embodiment of the present invention is used as an example herein. During time t1 to t3, the first input signal Gout(n), which the second input terminal IN2 of the n+2 stage circuit receives from the output of the former n stage circuit, is a logic high level signal. At this time, the first transistor T1 is turned on, and the first scan signal Vfwd inputted from the first input terminal IN1 precharges the first capacitor C1, and accordingly, the voltage of Q point rises gradually.

At time t3, the first input signal Gout(n) is changed into a logic low level signal, and the first transistor T1 is turned off. Because of the discharging of the first capacitor C1, the second transistor T2 is turned on. At this time, the first clock signal CK2O is a logic high level signal. The first clock signal CK2O is provided to the output terminal OUT, and the output terminal OUT outputs an output signal Gout(n+2).

During time t3 to t7, the third input terminal IN3 continues to receive the first clock signal CK2O. Normally, the output terminal OUT would continue to output the output signal Gout(n+2). However, at time t5, a second clock signal CK1BO is changed into a logic high level signal such that the pull-down circuit 140 is turned on. At this time, the output terminal OUT is grounded, and therefore, the output terminal OUT will not output the output signal Gout(n+2).

Figure 1:
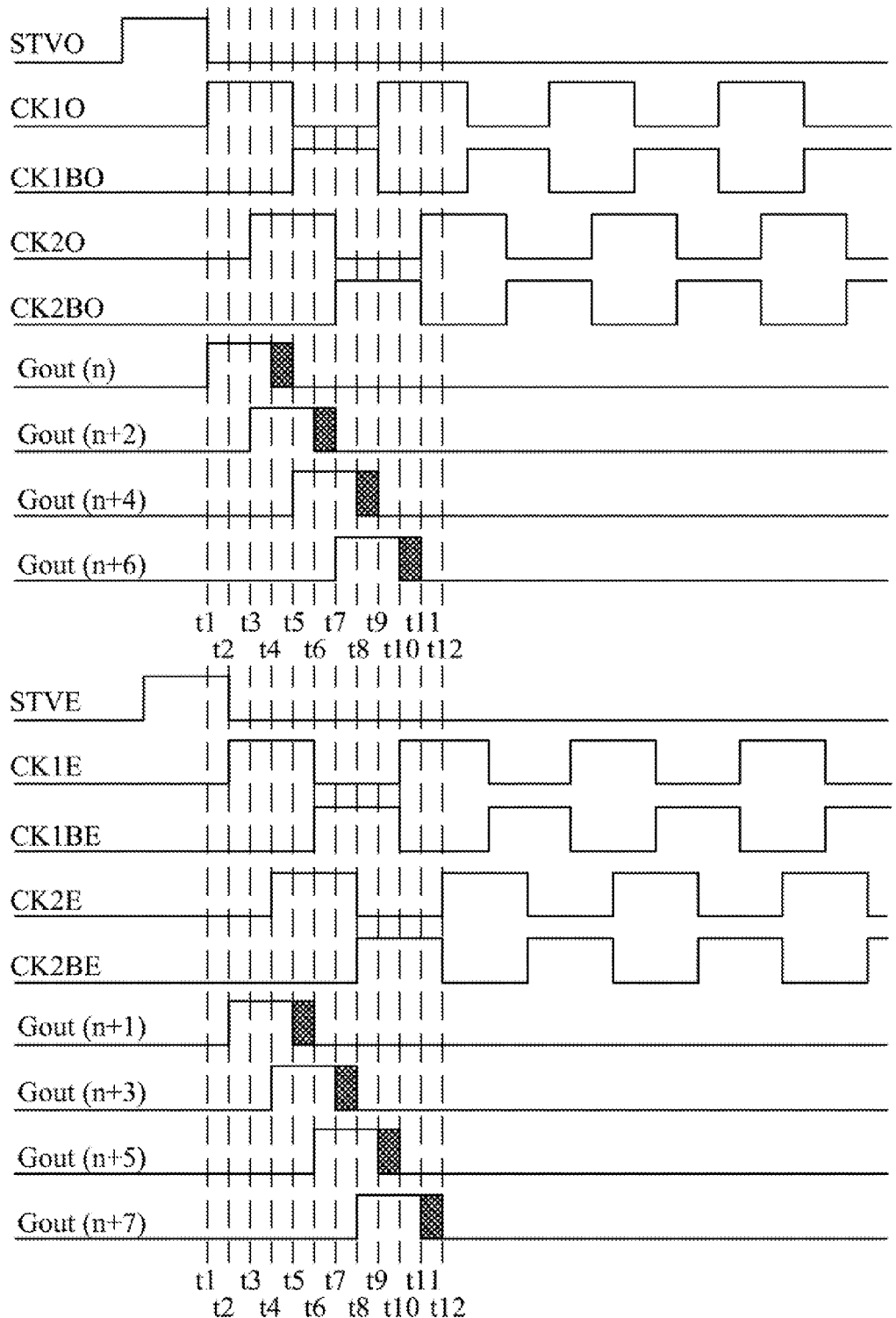
FIG. 1 schematically shows an operation waveform diagram of a gate driving circuit according to the prior art.

Compared with the operation waveform diagram of the prior art gate driving circuit as shown in FIG. 1, with reference to FIG. 3, there is a reduction in the overlapping portions of the output signals Gout(n) and Gout(n+1) of the n stage circuit and the n+1 stage circuit in the gate driving circuit of the embodiment of the present invention. If the time unit of the prior art described in FIG. 1 is also used herein, the overlapping portions of the present invention is about only one time unit.

As a result, compared with the prior art, the gate driving circuit of the embodiment of the present invention improves the problem of pixel flickering and higher circuit power consumption resulting from the output signals of the conventional gate driving circuit overlapping with each other. Furthermore, compared with the prior art, the gate driving circuit of the embodiment of the present invention enhances image quality and results in about a two-thirds reduction in power consumption.

Specifically, with reference to FIG. 2, in one circuit arrangement of the embodiment of the present invention, the gate driving circuit further comprises a fourth input terminal IN4 and a fifth input terminal IN5. The fourth input terminal IN4 is configured to receive a second clock signal CK1BO, and the fifth input terminal IN5 is configured to receive a first scan signal Vfwd. Specifically, the pull-down circuit 140 comprises a fourth transistor T4 and a fifth transistor T5. Each of the fourth transistor T4 and the fifth transistor T5 comprises a first terminal, a control terminal, and a second terminal. With respect to structure, the first terminal of the fourth transistor T4 is electrically coupled to the output terminal OUT, and the control terminal of the fourth transistor T4 is electrically coupled to the fourth input terminal IN4. The first terminal of the fifth transistor T5 is electrically coupled to the second terminal of the fourth transistor T4, the control terminal of the fifth transistor T5 is electrically coupled to the fifth input terminal IN5, and the second terminal of the fifth transistor T5 is electrically coupled to the ground terminal through the voltage regulator circuit 120.

In this embodiment, with reference to FIGS. 2 and 3, the operation mode of the gate driving circuit herein is similar to the condition of said forward scanning period. First, in the forward scan period, the first scan signal Vfwd is a logic high level signal. Hence, the fifth transistor T5 is turned on. Furthermore, at time t5, the second clock signal CK1BO inputted into the fourth input terminal IN4 is changed into a logic high level signal. At this time, the fourth transistor T4 is turned on such that the output terminal OUT is grounded through the fourth transistor T4 and the fifth transistor T5. Hence, the output terminal OUT will not output said output signal Gout (n+2). In other words, as can be seen in FIG. 3, the second clock signal CK1BO is a quarter of a period behind the first clock signal CK2O. Hence, after the first clock signal CK2O is provided to the output terminal OUT as the output signal Gout(n+2) for a quarter of a period, the second clock signal CK1BO enables the pull-down circuit 140 to be turned on. Hence, the first clock signal CK2O is pulled down, and the output terminal OUT will not output said output signal Gout (n+2), which improves the problem of pixel flickering and higher circuit power consumption resulting from output signals of the conventional gate driving circuit overlapping with each other.

Figure 4:
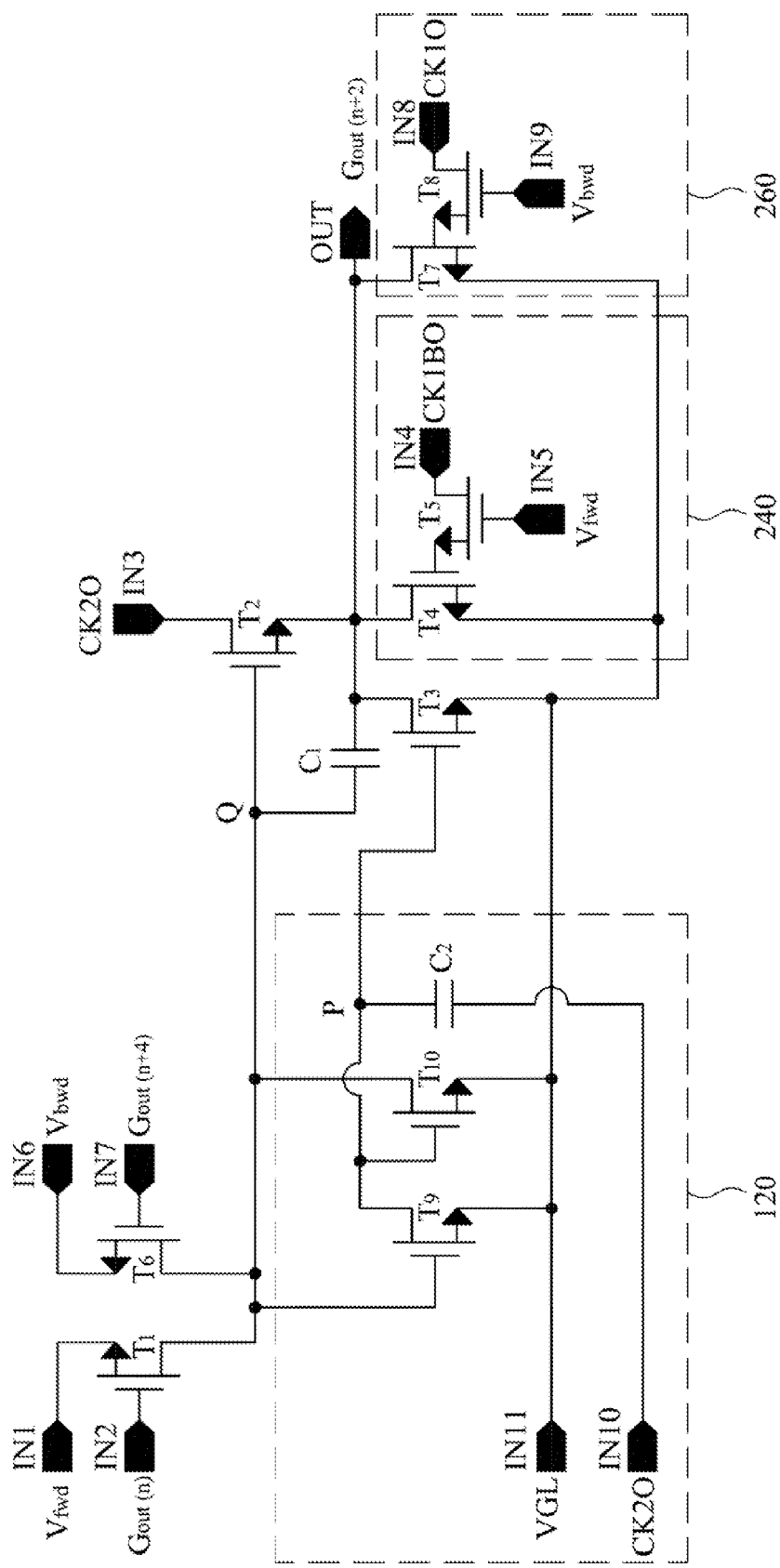
FIG. 4 schematically shows a diagram of a gate driving circuit according to embodiments of the present invention.

In addition, in another circuit arrangement of the embodiment of the present invention, with reference to FIG. 4, the gate driving circuit further comprises a pull-down circuit 240, a fourth input terminal IN4, and a fifth input terminal IN5. The fourth input terminal IN4 is configured to receive a second clock signal CK1BO, and the fifth input terminal IN5 is configured to receive a first scan signal Vfwd. Specifically, the pull-down circuit 240 comprises a fourth transistor T4 and a fifth transistor T5. Each of the fourth transistor T4 and the fifth transistor T5 comprises a first terminal, a control terminal, and a second terminal. With respect to structure, the first terminal of the fourth transistor T4 is electrically coupled to the output terminal OUT, and the second terminal of the fourth transistor T4 is electrically coupled to the ground terminal through the voltage regulator circuit 120. The first terminal of the fifth transistor T5 is electrically coupled to the fourth input terminal IN4, the control terminal of the fifth transistor T5 is electrically coupled to the fifth input terminal IN5, and the second terminal of the fifth transistor T5 is electrically coupled to the control terminal of the fourth transistor T4.

In this embodiment, with reference to both FIGS. 3 and 4, the operation mode of the gate driving circuit herein is similar to the condition of said forward scanning period. First, in the forward scan period, the first scan signal Vfwd is a logic high level signal. Hence, the fifth transistor T5 is turned on. Furthermore, at time t5, the second clock signal CK1BO inputted into the fourth input terminal IN4 is changed into a logic high level signal. At this time, the fourth transistor T4 is turned on through the fifth transistor T5 such that the output terminal OUT is grounded through the fourth transistor T4. Hence, the output terminal OUT will not output said output signal Gout (n+2). In other words, as can be seen in FIG. 3, the second clock signal CK1BO is a quarter of a period behind the first clock signal CK2O. Hence, after the first clock signal CK2O is provided to the output terminal OUT as the output signal Gout(n+2) for a quarter of a period, the second clock signal CK1BO enables the pull-down circuit 240 to be turned on. Hence, the first clock signal CK2O is pulled down, and the output terminal OUT will not output said output signal Gout (n+2), which improves the problem of pixel flickering and higher circuit power consumption resulting from the output signals of the conventional gate driving circuit overlapping with each other.

Subsequently, the condition of the signal in a backward scanning period is described herein. With reference to FIG. 2, the gate driving circuit further comprises a pull-down circuit 160, a sixth input terminal IN6, a seventh input terminal IN7, and a sixth transistor T6. The sixth input terminal IN6 is configured to receive a second scan signal Vbwd, and the seventh input terminal IN7 is configured to receive a second input signal Gout(n+4). The sixth transistor T6 comprises a first terminal, a control terminal, and a second terminal. With respect to structure, the first terminal of the sixth transistor T6 is electrically coupled to the sixth input terminal IN6, the control terminal of the sixth transistor T6 is electrically coupled to the seventh input terminal IN7, and the second terminal of the sixth transistor T6 is electrically coupled to the control terminal of the second transistor T2.

Figure 5:
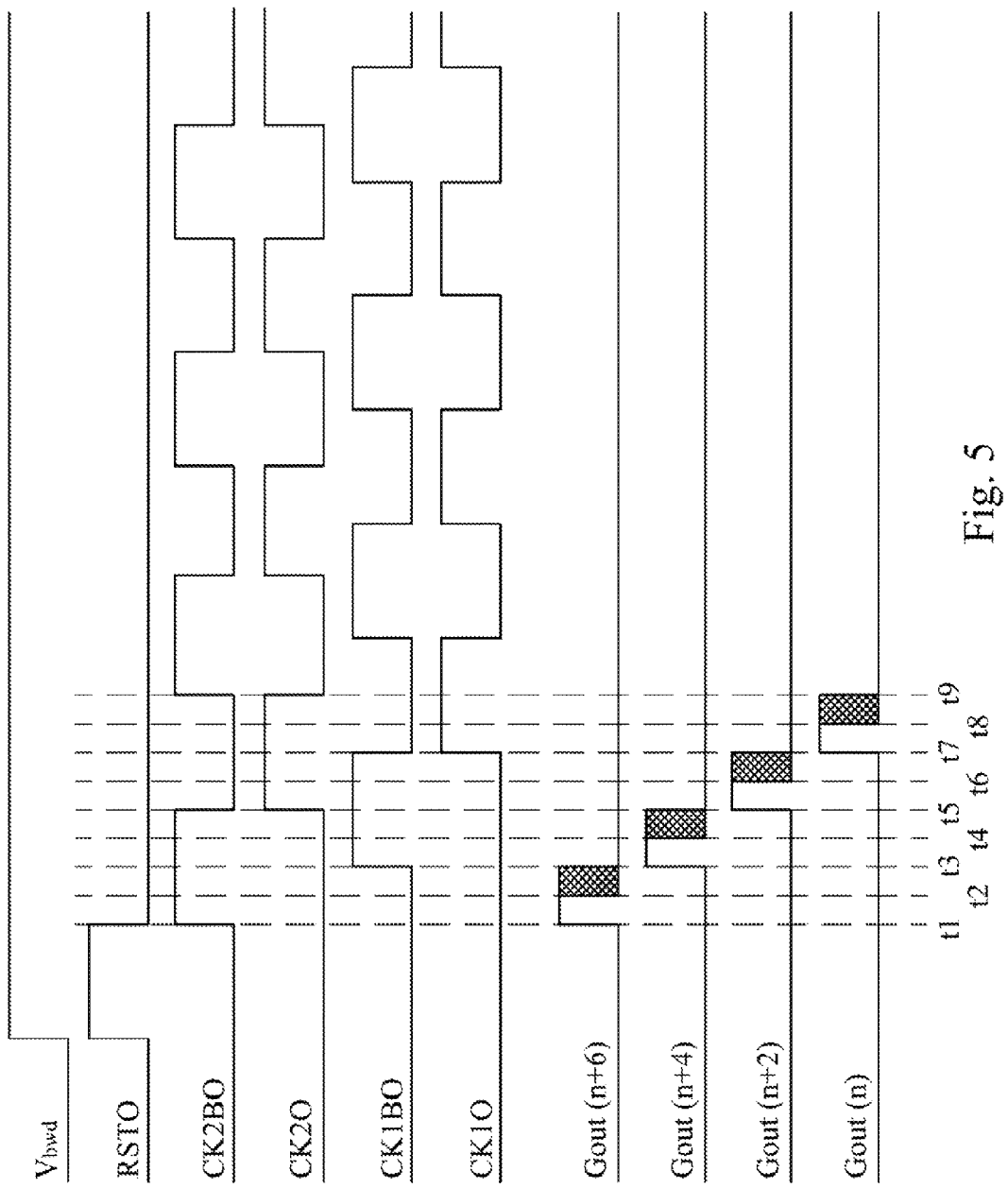
FIG. 5 schematically shows an operation waveform diagram of a gate driving circuit according to embodiments of the present invention.

For easy understanding of the overall operation of the gate driving circuit of the embodiment of the present invention, reference is now made to both FIGS. 2 and 5, in which FIG. 5 schematically shows an operation waveform diagram of a gate driving circuit according to embodiments of the present invention. First, during the backward period, the second scan signal Vbwd is a logic high level signal. During time t3 to t5, the n+2 stage circuit of the gate driving circuit herein is used as an example. The second input signal Gout(n+4) which the seventh input terminal IN7 receives from the output of the n+4 stage circuit of the gate driving circuit is a logic high level signal. At this time, the sixth transistor T6 is turned on, the second scan signal Vbwd inputted from the sixth input terminal IN6 precharges the first capacitor C1, and accordingly, the voltage of Q point rises gradually.

At time t5, the second input signal Gout(n+4) is changed into a logic low level signal, and the sixth transistor T6 is turned off. Because of the discharging of the first capacitor C1, the second transistor T2 is turned on. At this time, the first clock signal CK2O is a logic high level signal. The first clock signal CK2O is provided to the output terminal OUT, and the output terminal OUT outputs an output signal Gout(n+2).

During time t5 to t9, the third input terminal IN3 continues to receive the first clock signal CK2O. Normally, the output terminal OUT would continue to output the output signal Gout(n+2). However, at time t7, a third clock signal CK1O is changed into a logic high level signal such that the pull-down circuit 160 is turned on. At this time, the output terminal OUT is grounded, and therefore, the output terminal OUT does not output said output signal Gout(n+2).

With reference to FIG. 5, the output signals Gout(n) and Gout(n+2) of the n and the n+2 stage circuit in the gate driving circuit of the embodiment of the present invention do not overlap each other. Therefore, compared with the prior art, it is apparent that the gate driving circuit of the embodiment of the present invention improves the problem of pixel flickering and higher circuit power consumption resulting from the output signals of the gate driving circuit overlapping each other.

Specifically, with reference to FIG. 2, in one circuit arrangement of the embodiment of the present invention, the gate driving circuit further comprises a pull-down circuit 160, an eighth input terminal IN8, and a ninth input terminal IN9. The eighth input terminal IN8 is configured to receive the third clock signal CK1O, and the ninth input terminal IN9 is configured to receive the second scan signal Vbwd. The pull-down circuit 160 comprises a seventh transistor T7 and an eighth transistor T8. Each of the seventh transistor T7 and the eighth transistor T8 comprises a first terminal, a control terminal, and a second terminal. With respect to structure, the first terminal of the seventh transistor T7 is electrically coupled to the output terminal OUT, and the control terminal of the seventh transistor T7 is electrically coupled to the eighth input terminal IN8. The first terminal of the eighth transistor T8 is electrically coupled to the second terminal of the seventh transistor T7, the control terminal of the eighth transistor T8 is electrically coupled to the ninth input terminal IN9, and the second terminal of the eighth transistor T8 is electrically coupled to the ground terminal through the voltage regulator circuit 120.

In this embodiment, with reference to FIGS. 2 and 5, the operation mode of the gate driving circuit herein is similar to the condition of said backward scanning period. First, in the backward scan period, the second scan signal Vbwd is a logic high level signal. Hence, the eighth transistor T8 is turned on. Furthermore, at time t7, the third clock signal CK1O inputted into the eighth input terminal IN8 is changed into a logic high level signal. At this time, the seventh transistor T7 is turned on such that the output terminal OUT is grounded through the seventh transistor T7 and the eighth transistor T8. Hence, the output terminal OUT will not output said output signal Gout(n+2). In other words, as can be seen in FIG. 5, the third clock signal CK1O is a quarter of a period behind the first clock signal CK2O. Hence, after the first clock signal CK2O is provided to the output terminal OUT as the output signal Gout(n+2) for a quarter of a period, the third clock signal CK1O enables the pull-down circuit 160 to be turned on. Hence, the first clock signal CK2O is pulled down, and the output terminal OUT will not output said output signal Gout (n+2), which improves the problem of pixel flickering and higher circuit power consumption resulting from the output signals of the gate driving circuit stages of the conventional GIP structure overlapping each other.

In addition, in another circuit arrangement of the embodiment of the present invention, with reference to FIG. 4, the gate driving circuit further comprises a pull-down circuit 260, an eighth input terminal IN8, and a ninth input terminal IN9. The eighth input terminal IN8 is configured to receive a third clock signal CK1O, and the ninth input terminal IN9 is configured to receive a second scan signal Vbwd. The pull-down circuit 260 comprises a seventh transistor T7 and an eighth transistor T8. Each of the seventh transistor T7 and the eighth transistor T8 comprises a first terminal, a control terminal, and a second terminal. With respect to structure, the first terminal of the seventh transistor T7 is electrically coupled to the output terminal OUT, and the second terminal of the seventh transistor T7 is electrically coupled to the ground terminal through the voltage regulator circuit 120. The first terminal of the eighth transistor T8 is electrically coupled to the eighth input terminal IN8, the control terminal of the eighth transistor T8 is electrically coupled to the ninth input terminal IN9, and the second terminal of the eighth transistor T8 is electrically coupled to the control terminal of the seventh transistor T7.

In this embodiment, with reference to both FIGS. 4 and 5, the operation mode of the gate driving circuit herein is similar to the condition of said backward scanning period. First, in the backward scan period, the second scan signal Vbwd is a logic high level signal. Hence, the eighth transistor T8 is turned on. Furthermore, at time t7, the third clock signal CK1O inputted into the eighth input terminal IN8 is changed into a logic high level signal. At this time, the seventh transistor T7 is turned on through the eighth transistor T8 such that the output terminal OUT is grounded through the seventh transistor T7. Hence, the output terminal OUT will not output said output signal Gout(n+2). In other words, as shown in FIG. 5, the third clock signal CK1O is a quarter of a period behind the first clock signal CK2O. Hence, after the first clock signal CK2O is provided to the output terminal OUT as the output signal Gout(n+2) for a quarter of a period, the third clock signal CK1O enables the pull-down circuit 260 to be turned on. Hence, the first clock signal CK2O is pulled down, and the output terminal OUT will not output said output signal Gout(n+2), which improves the problem of pixel flickering and higher circuit power consumption resulting from the output signals of the gate driving circuit stages of the conventional GIP structure overlapping each other.

In addition, the voltage regulator circuit 120 as shown in FIGS. 2 and 4 comprises a tenth input terminal IN10, an eleventh input terminal IN11, a ninth transistor T9, a tenth transistor T10, and a second capacitor C2. The tenth input terminal IN10 is configured to receive the first clock signal CK2O, and the eleventh input terminal IN11 is configured to receive a ground signal VGL. Furthermore, each of the ninth transistor T9 and the tenth transistor T10 comprises a first terminal, a control terminal, and a second terminal. With respect to structure, the first terminal of the ninth transistor T9 is electrically coupled to the control terminal of the third transistor T3, the control terminal of the ninth transistor T9 is electrically coupled to the control terminal of the second transistor T2, and the second terminal of the ninth transistor T9 is electrically coupled to the ground terminal through the eleventh input terminal IN11. In addition, the first terminal of the tenth transistor T10 is electrically coupled to the control terminal of the second transistor T2, the control terminal of the tenth transistor T10 is electrically coupled to the control terminal of the third transistor T3, and the second terminal of the tenth transistor T10 is electrically coupled to the ground terminal through the eleventh input terminal IN11. In addition, the second capacitor C2 is electrically coupled between the tenth input terminal IN10 and the control terminal of the third transistor T3.

In view of the foregoing embodiments of the present invention, many advantages of the present invention are now apparent. The embodiment of the present invention provides the gate driving circuit, which improves the problem of pixel flickering and higher circuit power consumption resulting from the output signals of the conventional GIP structure overlapping each other. Furthermore, compared with the prior art, the gate driving circuit of the embodiment of the present invention enhances image quality and results in about a two-thirds reduction in power consumption.

What is claimed is:

1. A gate driving circuit comprising:
    a first input terminal configured to receive a first scan signal;
    a second input terminal configured to receive a first input signal;
    a third input terminal configured to receive a first clock signal;
    an output terminal;
    a first transistor comprising:
        a first terminal electrically coupled to the first input terminal;
        a control terminal electrically coupled to the second input terminal; and
        a second terminal;
    a second transistor comprising:
        a first terminal electrically coupled to the third input terminal;
        a control terminal electrically coupled to the second terminal of the first transistor; and
        a second terminal electrically coupled to the output terminal;
    a third transistor comprising:
        a first terminal electrically coupled to the output terminal;
        a control terminal; and
        a second terminal electrically coupled to a ground terminal;
    a voltage regulator circuit electrically coupled to the control terminal of the second transistor, the control terminal of the third transistor, and the ground terminal;
    a capacitor electrically coupled between the control terminal of the second transistor and the output terminal;
    a pull-down circuit electrically coupled to the output terminal and the ground terminal, wherein the pull-down circuit comprises a fourth transistor and a fifth transistor, and the fourth transistor and the fifth transistor comprise a first terminal, a control terminal, and a second terminal respectively, wherein the first terminal or the second terminal of the fifth transistor is electrically coupled to the second terminal or the control terminal of the fourth transistor,
    a fourth input terminal configured to receive a second clock signal; and
    a fifth input terminal configured to receive the first scan signal;
    wherein the first terminal of the fourth transistor is electrically coupled to the output terminal, the control terminal of the fourth transistor is electrically coupled to the fourth input terminal, the first terminal of the fifth transistor is electrically coupled to the second terminal of the fourth transistor, the control terminal of the fifth transistor is electrically coupled to the fifth input terminal, and the second terminal of the fifth transistor is electrically coupled to the ground terminal.

2. The gate driving circuit according to claim 1, wherein the second clock signal is a quarter of a period behind the first clock signal.

3. The gate driving circuit according to claim 1, wherein in a forward scan period, the first scan signal is a logic high level signal.

4. The gate driving circuit according to claim 1, further comprising:
    a sixth input terminal configured to receive a second scan signal;
    a seventh input terminal configured to receive a second input signal; and
    a sixth transistor comprising:
        a first terminal electrically coupled to the sixth input terminal;
        a control terminal electrically coupled to the seventh input terminal; and
        a second terminal electrically coupled to the control terminal of the second transistor.

5. The gate driving circuit according to claim 4, further comprising:
    an eighth input terminal configured to receive a third clock signal; and
    a ninth input terminal configured to receive a second scan signal;
    wherein the pull-down circuit comprises:
        a seventh transistor comprising:
            a first terminal electrically coupled to the output terminal;
            a control terminal electrically coupled to the eighth input terminal; and
            a second terminal; and
        an eighth transistor comprising:
            a first terminal electrically coupled to the second terminal of the seventh transistor;
            a control terminal electrically coupled to the ninth input terminal; and
            a second terminal electrically coupled to the ground terminal.

6. The gate driving circuit according to claim 4, further comprising:
    an eighth input terminal configured to receive a third clock signal; and
    a ninth input terminal configured to receive a second scan signal;
    wherein the pull-down circuit comprises:
        a seventh transistor comprising:
            a first terminal electrically coupled to the output terminal;
            a control terminal; and
            a second terminal electrically coupled to the ground terminal; and
        an eighth transistor comprising:
            a first terminal electrically coupled to the eighth input terminal;
            a control terminal electrically coupled to the ninth input terminal; and
            a second terminal electrically coupled to the control terminal of the seventh transistor.

7. The gate driving circuit according to claim 5, wherein the third clock signal is a quarter of a period behind the first clock signal.

8. The gate driving circuit according to claim 6, wherein the third clock signal is a quarter of a period behind the first clock signal.

9. The gate driving circuit according to claim 5, wherein in a backward scan period, the second scan signal is a logic high level signal.

10. The gate driving circuit according to claim 6, wherein in a backward scan period, the second scan signal is a logic high level signal.

11. A gate driving circuit comprising:
a first input terminal configured to receive a first scan signal;
a second input terminal configured to receive a first input signal;
a third input terminal configured to receive a first clock signal;
an output terminal;
a first transistor comprising:
a first terminal electrically coupled to the first input terminal;
a control terminal electrically coupled to the second input terminal; and
a second terminal;
a second transistor comprising:
a first terminal electrically coupled to the third input terminal;
a control terminal electrically coupled to the second terminal of the first transistor; and
a second terminal electrically coupled to the output terminal;
a third transistor comprising:
a first terminal electrically coupled to the output terminal;
a control terminal; and
a second terminal electrically coupled to a ground terminal;
a voltage regulator circuit electrically coupled to the control terminal of the second transistor, the control terminal of the third transistor, and the ground terminal;
a capacitor electrically coupled between the control terminal of the second transistor and the output terminal;
a pull-down circuit electrically coupled to the output terminal and the ground terminal, wherein the pull-down circuit comprises a fourth transistor and a fifth transistor, and the fourth transistor and the fifth transistor comprise a first terminal, a control terminal, and a second terminal respectively, wherein the first terminal or the second terminal of the fifth transistor is electrically coupled to the second terminal or the control terminal of the fourth transistor,
a fourth input terminal configured to receive a second clock signal; and
a fifth input terminal configured to receive the first scan signal;
wherein the first terminal of the fourth transistor is electrically coupled to the output terminal, the second terminal of the fourth transistor is electrically coupled to the ground terminal, the first terminal of the fifth transistor is electrically coupled to the fourth input terminal, the control terminal of the fifth transistor is electrically coupled to the fifth input terminal, and the second terminal of the fifth transistor is electrically coupled to the control terminal of the fourth transistor.

12. The gate driving circuit according to claim 11, wherein the second clock signal is a quarter of a period behind the first clock signal.

13. The gate driving circuit according to claim 11, wherein in a forward scan period, the first scan signal is a logic high level signal.

14. The gate driving circuit according to claim 11, further comprising:
a sixth input terminal configured to receive a second scan signal;
a seventh input terminal configured to receive a second input signal; and
a sixth transistor comprising:
a first terminal electrically coupled to the sixth input terminal;
a control terminal electrically coupled to the seventh input terminal; and
a second terminal electrically coupled to the control terminal of the second transistor.

15. The gate driving circuit according to claim 14, further comprising:
an eighth input terminal configured to receive a third clock signal; and
a ninth input terminal configured to receive a second scan signal;
wherein the pull-down circuit comprises:
a seventh transistor comprising:
a first terminal electrically coupled to the output terminal;
a control terminal electrically coupled to the eighth input terminal; and
a second terminal; and
an eighth transistor comprising:
a first terminal electrically coupled to the second terminal of the seventh transistor;
a control terminal electrically coupled to the ninth input terminal; and
a second terminal electrically coupled to the ground terminal.

16. The gate driving circuit according to claim 14, further comprising:
an eighth input terminal configured to receive a third clock signal; and
a ninth input terminal configured to receive a second scan signal;
wherein the pull-down circuit comprises:
a seventh transistor comprising:
a first terminal electrically coupled to the output terminal;
a control terminal; and
a second terminal electrically coupled to the ground terminal; and
an eighth transistor comprising:
a first terminal electrically coupled to the eighth input terminal;
a control terminal electrically coupled to the ninth input terminal; and
a second terminal electrically coupled to the control terminal of the seventh transistor.

17. The gate driving circuit according to claim 15, wherein the third clock signal is a quarter of a period behind the first clock signal.

18. The gate driving circuit according to claim 16, wherein the third clock signal is a quarter of a period behind the first clock signal.

19. The gate driving circuit according to claim 15, wherein in a backward scan period, the second scan signal is a logic high level signal.

20. The gate driving circuit according to claim 16, wherein in a backward scan period, the second scan signal is a logic high level signal.

\* \* \* \* \*